United States Patent
White et al.

(10) Patent No.: US 8,147,614 B2
(45) Date of Patent: Apr. 3, 2012

(54) MULTI-GAS FLOW DIFFUSER

(75) Inventors: John M. White, Hayward, CA (US);
Carl Sorensen, Morgan Hill, CA (US);
Robin Tiner, Santa Cruz, CA (US);
Beom Soo Park, San Jose, CA (US);
Soo Young Choi, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 12/794,756

(22) Filed: Jun. 6, 2010

(65) Prior Publication Data
US 2010/0311249 A1    Dec. 9, 2010

Related U.S. Application Data

(60) Provisional application No. 61/185,400, filed on Jun. 9, 2009.

(51) Int. Cl.
*C23C 16/00* (2006.01)

(52) U.S. Cl. ............. 118/715; 118/723 ER; 118/723 IR; 156/345.34

(58) Field of Classification Search ............... 118/723 E, 118/715, 723 ME, 723 ER, 723 IR; 156/345.34, 156/345.33
See application file for complete search history.

(56) References Cited

U.S. PATENT DOCUMENTS

| | | | |
|---|---|---|---|
| 5,595,606 A | 1/1997 | Fujikawa et al. | |
| 5,624,498 A | 4/1997 | Lee et al. | |
| 5,904,487 A * | 5/1999 | Conboy et al. ................. | 438/14 |
| 6,284,673 B2 | 9/2001 | Dunham | |
| 6,368,450 B2 | 4/2002 | Hayashi | |
| 6,415,736 B1 | 7/2002 | Hao et al. | |
| 6,461,435 B1 * | 10/2002 | Littau et al. ................... | 118/715 |
| 6,468,925 B2 * | 10/2002 | Campbell et al. ............. | 438/771 |
| 6,537,419 B1 | 3/2003 | Kinnard | |
| 6,565,661 B1 | 5/2003 | Nguyen | |
| 6,663,715 B1 * | 12/2003 | Yuda et al. ................. | 118/723 R |
| 6,793,733 B2 | 9/2004 | Janakiraman et al. | |
| 6,942,753 B2 | 9/2005 | Choi et al. | |
| 7,270,713 B2 | 9/2007 | Blonigan et al. | |
| 7,429,410 B2 | 9/2008 | Keller et al. | |
| 2002/0017243 A1 | 2/2002 | Pyo | |
| 2002/0129769 A1 | 9/2002 | Kim et al. | |
| 2003/0019580 A1 | 1/2003 | Strang | |
| 2003/0155079 A1 * | 8/2003 | Bailey et al. ............. | 156/345.49 |
| 2003/0207033 A1 | 11/2003 | Yim et al. | |
| 2005/0133160 A1 | 6/2005 | Kennedy et al. | |
| 2005/0133161 A1 | 6/2005 | Carpenter et al. | |
| 2007/0044714 A1 | 3/2007 | White | |
| 2010/0136216 A1 | 6/2010 | Tsuei et al. | |

FOREIGN PATENT DOCUMENTS

| | | |
|---|---|---|
| KR | 2006-0014495 A | 2/2006 |
| KR | 2006-0135184 A | 12/2006 |

* cited by examiner

*Primary Examiner* — Richard A. Booth
(74) *Attorney, Agent, or Firm* — Patterson & Sheridan, L.L.P.

(57) ABSTRACT

Embodiments of the disclosure generally provide a method and apparatus for processing a substrate in a vacuum process chamber. In one embodiment a vacuum process chamber is provided that includes a chamber body and lid disposed on the chamber body. A blocker plate is coupled to the lid and bounds a staging plenum therewith. A gas distribution plate is coupled to the lid. The gas distribution plate separates a main plenum defined between the gas distribution plate and the blocker plate from a process volume defined within the chamber body. The gas distribution plate and the blocker plate define a spacing gradient therebetween which influences mixing of gases within the main plenum.

12 Claims, 10 Drawing Sheets

FIG. 1

(PRIOR ART)

MULTI-GAS FLOW DIFFUSER

CROSS-REFERENCE TO RELATED APPLICATIONS

This application claims benefit of U.S. Patent Provisional Application Ser. No. 61/185,400, filed Jun. 9, 2009, which is incorporated by reference in its entirety.

BACKGROUND OF THE INVENTION

1. Field of the Invention

Embodiments of the present invention generally relate to an apparatus and a method for distributing a process gas in a vacuum chamber. More particularly, this invention relates to an apparatus and a method for distributing a process gas in a vacuum chamber suitable for depositing silicon-containing films and the like.

2. Description of the Related Art

Plasma display panels and liquid crystal displays are frequently used for flat panel displays. Liquid crystal displays (LCD) generally contain two glass substrates joined together with a layer of a liquid crystal material sandwiched therebetween. The glass substrate may be a semiconductor substrate, or may be a transparent substrate such as a glass, quartz, sapphire, or a clear plastic film. The LCD may also contain light emitting diodes for back lighting.

Figure 1:
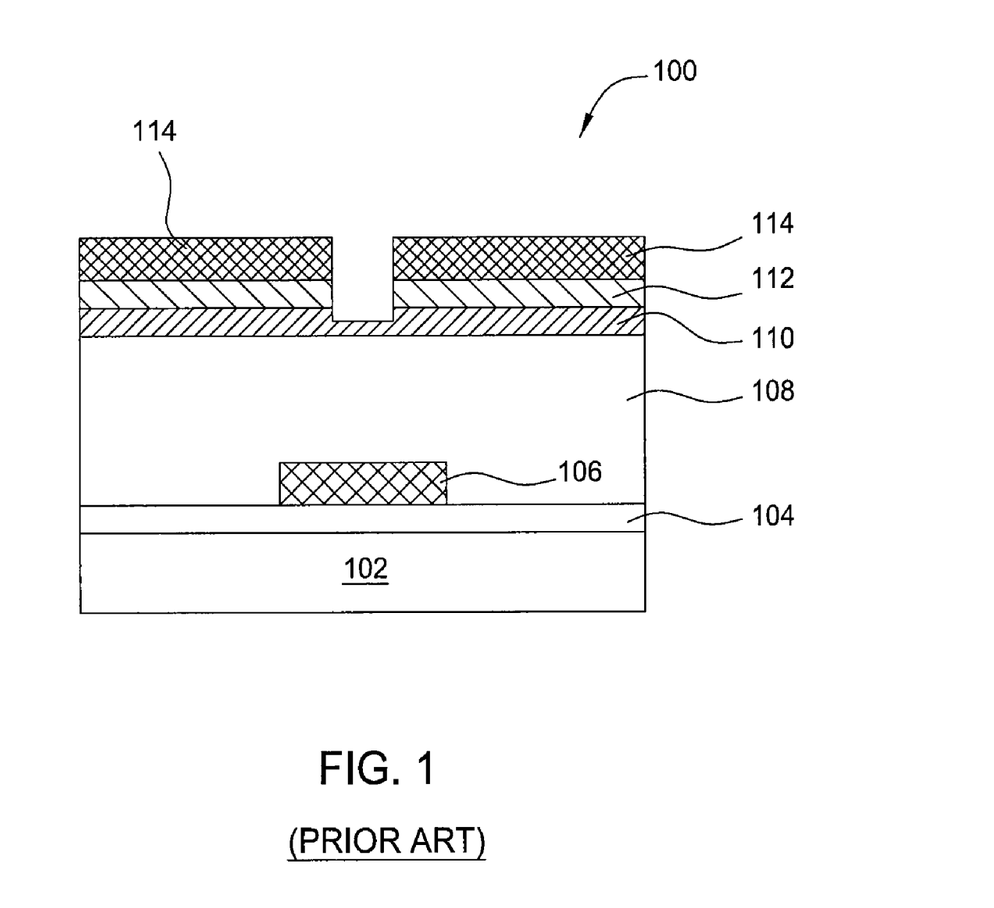
FIG. 1 depicts a sectional view of a conventional thin film transistor device structure formed on a substrate.

As the size requirements for liquid crystal displays have increased, the ability to deposit certain films having both acceptable film properties and acceptable film thickness uniformity within the same film has become increasingly difficult to achieve. FIG. 1 depicts a sectional view of a conventional thin film transistor (TFT) device structure 100 disposed on a substrate 102. A dielectric layer 104 may be optionally disposed on the substrate 102. Subsequently, a gate electrode 106 is formed and patterned on the dielectric layer 104 followed by a gate insulator layer 108. A semiconductor layer of amorphous silicon (a-Si) 110 is usually formed on the gate insulator layer 108 followed by a thin doped semiconductor layer of n-type or p-type amorphous silicon layer ($N^+/P^+$-a-Si) 112. After formation of the doped semiconductor layer 112, a source-drain metal electrode layer 114 is then disposed thereon to form the TFT device structure 100.

During deposition, process recipes are selected to deposit films with the most advantageous balance of film properties and film thicknesses. However, processes that produce the most desirable film properties are often achieved at the expense of the control of film thickness. For smaller large area substrates, the balance between good film properties and good film thickness uniformity was satisfactorily managed. However, conventional deposition processes which compromise film property and thickness cannot produce a film of sufficient quality to meet device performance requirements for larger large area substrates, i.e., substrates approaching and exceeding 40,000 $cm^2$ in plan area.

Therefore, there is a need for an improved apparatus and method for depositing a film having good film properties and thickness uniformity.

SUMMARY OF THE INVENTION

Embodiments of the disclosure generally provide a method and apparatus for processing a substrate in a vacuum process chamber. In one embodiment a vacuum process chamber is provided that includes a chamber body and lid disposed on the chamber body. A blocker plate is coupled to the lid and bounds a staging plenum therewith. A gas distribution plate is coupled to the lid. The gas distribution plate separates a main plenum defined between the gas distribution plate and the blocker plate from a process volume defined within the chamber body. The gas distribution plate and the blocker plate define a spacing gradient therebetween which influences mixing of gases within the main plenum.

In another embodiment, a vacuum process chamber is provided that includes a chamber body and lid disposed on the chamber body. A curved blocker plate is coupled to the lid and bounds a staging plenum therewith. A gas distribution plate is coupled to the lid. A center of the curved blocker plate is closer to the gas distribution plate than the edges of the curved blocker plate. At least one staging plenum gas inlet is arranged to provide a first gas from a gas source to the staging plenum while a plurality of directional main plenum gas inlets are arranged to induce a circular flow within the main plenum.

In yet another embodiment, a method for processing a substrate in a vacuum process chamber is provided that includes supplying a first gas through a lid of the vacuum process chamber to a staging plenum, supplying a second gas to a main plenum, the second gas bypassing the main plenum, mixing the first gas from the staging plenum with the second gas in the main plenum to create a non-homogenous gas mixture, flowing the mixed gas into the process volume, and processing the substrate in the process chamber in the presence of the mixed gas.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

Embodiments of the disclosure provide an apparatus and method for distributing gas in a vacuum process chamber. In one embodiment, the apparatus may be utilized to form a silicon-containing film. The silicon-containing film may be advantageously used in the fabrication of thin film transistor (TFT) devices, among other devices. As the apparatus allows for greater control of the ratio of process gases distributed in the process chamber, improved deposition results may be realized over conventional methods. The lateral control of the distribution of the process gases allows the deposition thicknesses in sections of the substrate to be independently, or at least somewhat independently, controlled of film properties, such as Si—H bond content, film stress, wet etch rate and reflective index. Thus, the invention enables deposition with both good film properties and good thickness uniformity on large area substrates, such as substrates up to and exceeding five meters square in surface plan area.

The invention also enables wider process windows for controlling film properties and thickness uniformity during the deposition of various silicon films, such as silicon nitride, amorphous silicon and doped α-si. The greater process window allows the different silicon films to be deposited in the same chamber without compromising the quality of one film at the expense of the other, thereby improving the quality of TFT's subsequently formed from those silicon films while reducing equipment requirements for chambers turned to deposit a single type of film.

Figure 2:
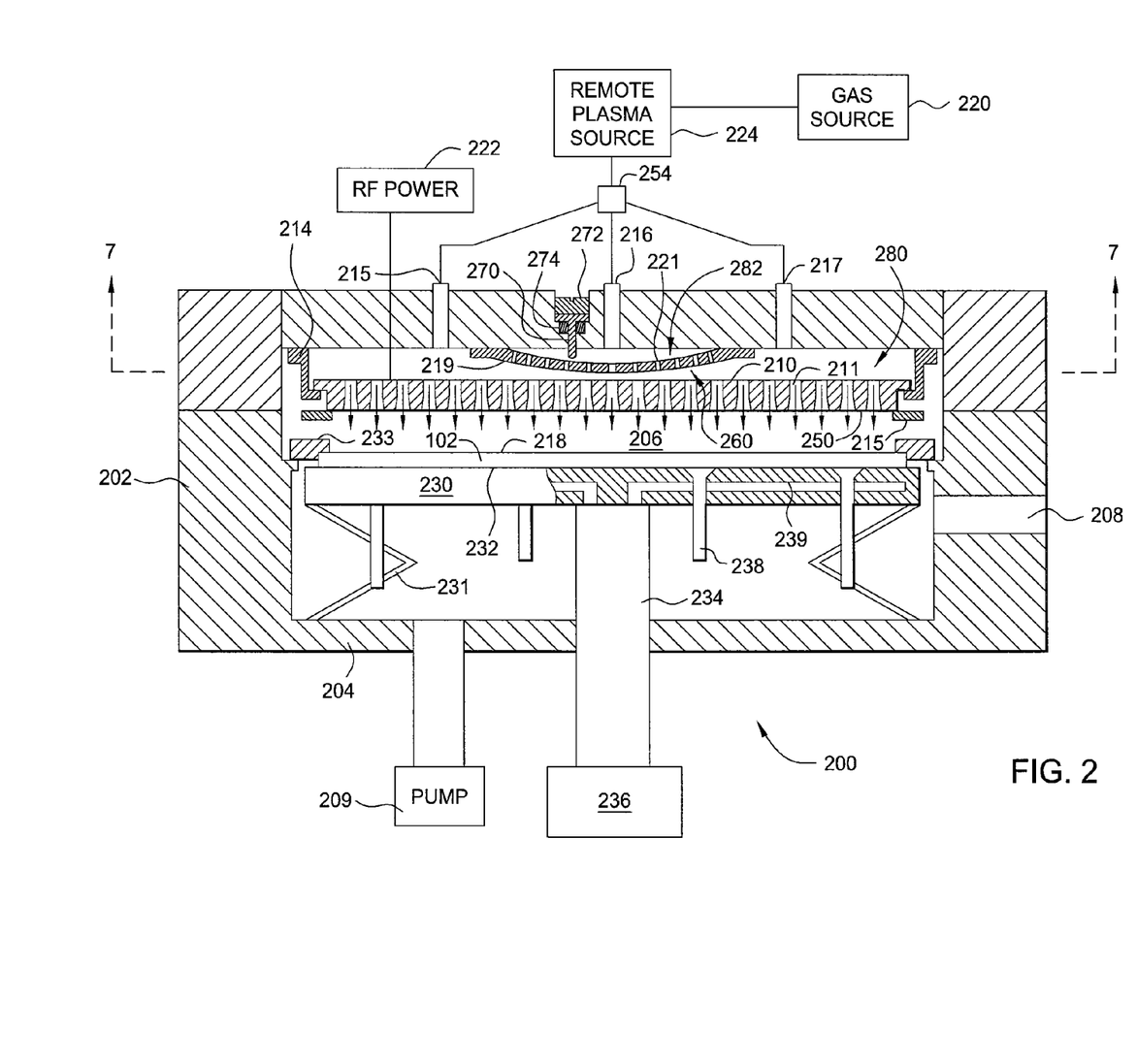
FIG. 2 depicts a schematic sectional view of a vacuum process chamber in accordance with one embodiment of the present invention.

FIG. 2 is a schematic cross-section view of one embodiment of a vacuum process chamber 200. In one embodiment, the vacuum process chamber 200 may be a plasma enhanced chemical vapor deposition chamber. One suitable plasma enhanced chemical vapor deposition chamber that may be adapted to benefit from the invention is available from AKT, Inc., a wholly owned subsidiary of Applied Materials, Inc., located in Santa Clara, Calif. It is contemplated that other deposition chambers, including those from other manufacturers, may be utilized to practice the present invention. It is also contemplated that other vacuum process chambers, such as plasma treatment chambers, etch chambers or other process chambers may benefit from use of the gas distribution aspects described herein.

The vacuum process chamber 200 includes a chamber body 201 having walls 202 surrounding a process volume 206. A lid 212 is disposed on the walls 202 of the chamber body 201 to enclose the process volume 206. A gas distribution plate 210 and substrate support assembly 230 are disposed in the process volume 206. The substrate support assembly 230 is accessed through a slit valve 208 formed through the wall 202 such that a substrate 102 may be transferred into and out of the vacuum process chamber 200.

An RF power source 222 is coupled to the lid 212 and/or to the gas distribution plate 210 to provide a RF power that creates an electric field between the gas distribution plate 210 and the substrate support assembly 230 so that a plasma may be generated from the gases between the gas distribution plate 210 and the substrate support assembly 230. The RF power may be applied at various RF frequencies.

The substrate support assembly 230 includes a substrate receiving surface 232 for supporting the substrate 102 thereon. A stem 234 couples the substrate support assembly 230 to a lift system 236 which raises and lowers the substrate support assembly 230 between substrate transfer and processing positions. A shadow frame 233 may be optionally placed over the periphery of the substrate 102 when processing to prevent deposition on the edge of the substrate 102. Lift pins 238 are moveably disposed through the substrate support assembly 230 and are adapted to space the substrate 102 from the substrate receiving surface 232. The substrate support assembly 230 may also include heating and/or cooling elements 239 utilized to maintain the substrate support assembly 230 at a desired temperature. The substrate support assembly 230 may also include conductive straps 231 to provide an RF return path around the periphery of the substrate support assembly 230.

The gas distribution plate 210 is coupled to the lid 212 and/or walls 202 of the vacuum process chamber 200 at its periphery by a suspension 214. The gas distribution plate 210 has a downstream surface 250 having an orientation substantially perpendicular to a centerline of the chamber body 201. The downstream surface 250 has a plurality of apertures 211 formed therethrough and facing an upper surface 218 of the substrate 102 supported on the substrate support assembly 230. The apertures 211 may have different shapes, number, densities, dimension and distributions across the gas distribution plate 210, such that the distribution of gas provided from a main plenum 280 defined between the lid 212 and the gas distribution plate 210 to the substrate 102 disposed in the process volume 206 may be controlled. In one embodiment, the diameter of the apertures 211 may be selected between 0.01 and about 1.00 inch. Examples of gas distribution plates that may be adapted to benefit from the invention are disclosed in U.S. Pat. No. 6,477,980 issued on Nov 12, 2002 to White, et al., U.S. Publication No. 2005/0251990 published on Nov. 17, 200 to Choi, et al., and U.S. Publication No. 2006/0060138 published on Mar. 23, 2006 to Keller, et al., which are all incorporated by reference in their entireties.

A blocker plate 219 is disposed between the lid 212 and the gas distribution plate 210. The blocker plate 219 is coupled to the lid 212 such that the downstream face of the blocker plate 219 is exposed to the main plenum 280 while a staging plenum 282 is defined between an upstream face of the blocker plate 219 and the lid 212. The downstream face of the blocker plate 219 has an orientation substantially perpendicular to the centerline of the chamber body 201. The blocker plate 219 includes a plurality of apertures 252 formed therethrough, thus allowing gas to flow through the blocker plate 219 from the staging plenum 282 into the main plenum 280 towards the gas distribution plate 210. The characteristics of the apertures 252 may be selected to have an appropriate shape, number, density, dimension and distribution across the blocker plate 219 so that the flow of gases from the staging plenum 282 through the blocker plate 219 into the main plenum 280 defined between the blocker plate 219 and the gas distribution plate 210 may be controlled as desired.

At least two gas inlet ports are formed through the lid 212 to provide process gases into the process volume 206 of the vacuum process chamber 200. At least one of the gas inlet ports, shown as staging plenum gas inlet port 216, provides gas to the staging plenum 282 defined between the blocker plate 219 and the lid 212. At least one of the gas inlet ports, shown as main plenum gas inlet ports 215, 217 is positioned to provide gas directly into the main plenum 280 defined between the gas distribution plate 210 and the blocker plate 219 without flowing through the staging plenum 282 and without intermixing with the gases flowing through the blocker plate 219 prior to those gases entering the main plenum 280.

The gas inlet ports 215, 216, 217 are coupled to at least one gas source for providing process and/or other gases utilized within the process volume 206. Suitable process gases are discussed further below. In the embodiment depicted in FIG. 2, a single gas source 220 may optionally provide gas to a remote plasma source 224, which provides disassociated species to the gas inlet ports 215, 216, 217. The remote plasma source 224 may also be utilized to disassociate a cleaning gas for cleaning chamber components. The cleaning gas may be further excited by the RF power provided to the gas distribution plate 210 by the RF power source 222. Suitable cleaning gases include, but are not limited to, $NF_3$, $F_2$, and $SF_6$.

A flow control device 254, such as a splitter, proportional valve, restrictor or the like, may be disposed between the remote plasma source 224 and the gas inlet ports 215, 216, 217, such that the ratio of gases provided to the main plenum gas inlet ports 215, 217 may be controlled relative to the gas provided to the staging plenum gas inlet port 216. The ratio set by flow control device 254 controls the amount of flow and/or pressure of gases provided to the staging and main plenums, such that the total amount of flow, or more precisely, the local pressure in the main plenum 280 behind the gas distribution plate 210 may be controlled resulting in a lateral profile or gradient of gases being delivered into the process volume 206 through the gas distribution plate 210 from the center relative to the edge of the substrate 102.

Figure 3:
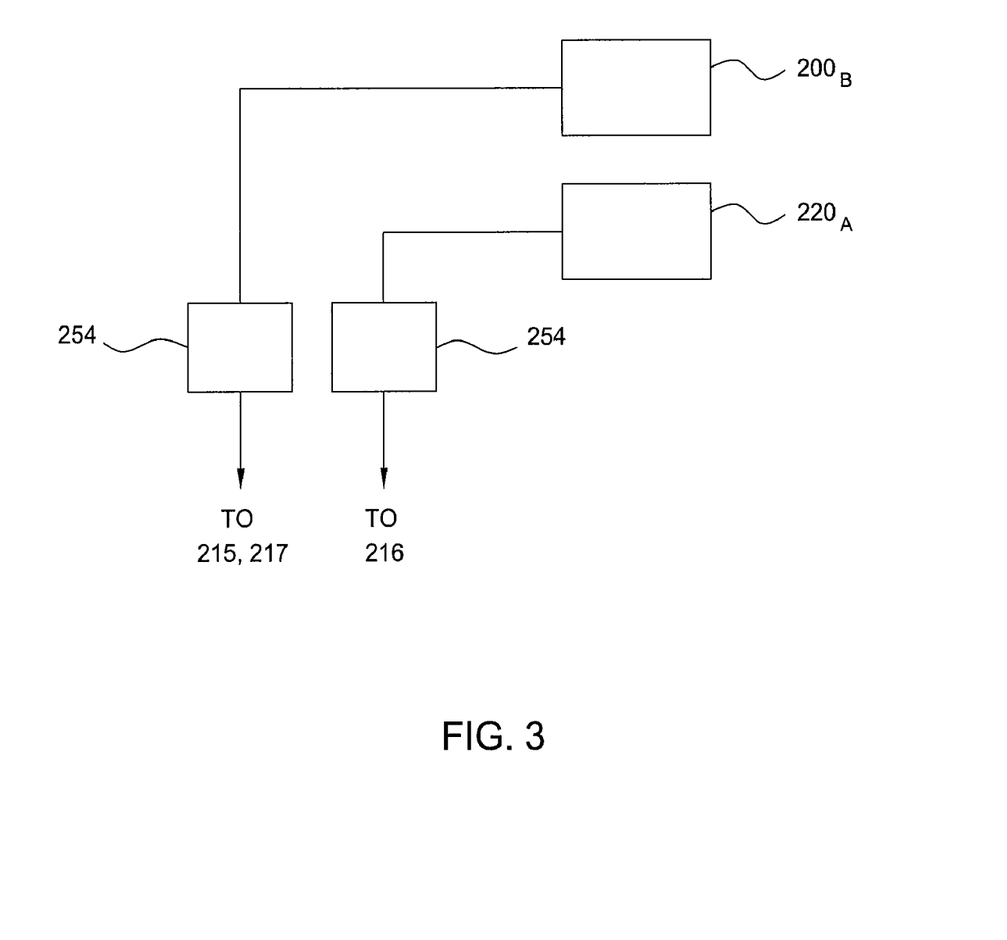
FIG. 3 depicts an alternative embodiment of a gas source suitable for use with the vacuum process chamber of FIG. 2.

Alternatively, as depicted in FIG. 3, separate gas sources 220A, 220B may be coupled to the staging plenum gas inlet port 216 and the main plenum gas inlet port ports 215, 217. This allows the radial distribution of gas composition provided to the process volume 206 to be controlled as the gas from source 220A delivered to the main plenum 280 is diluted by gas from source 220B provided from the staging plenum 282 through the blocker plate 219 into the main plenum 280. For example, more gas from source 220A provided through the blocker plate 219 results in a high concentration of gas provided from source 220B near the edge relative to the center of the gas distribution plate 210, and vice versa.

Figure 4A:
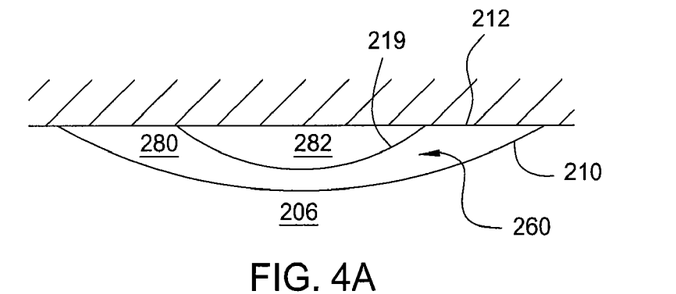
FIGS. 4A-D depict schematic illustrations of different spacing gradients defined between a blocker plate and a gas distribution plate.
Figure 4B:
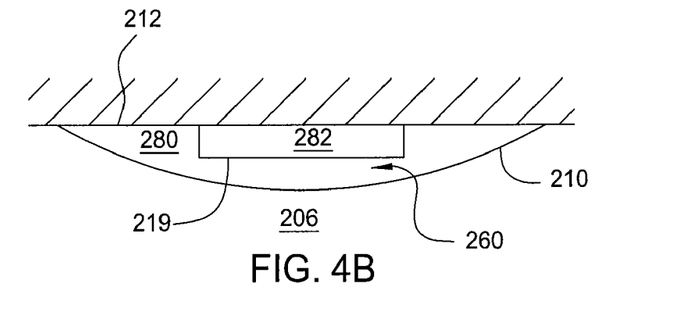
Figure 4C:
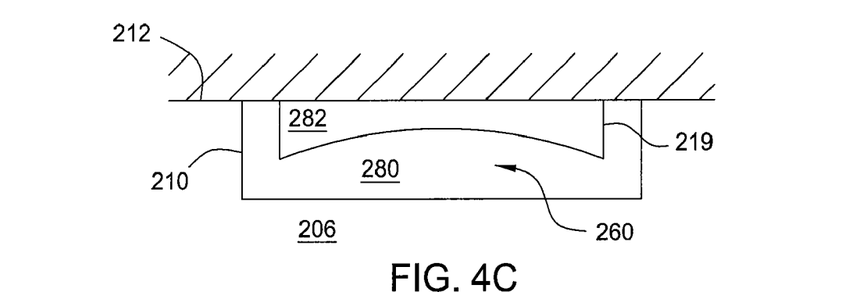
Figure 4D:
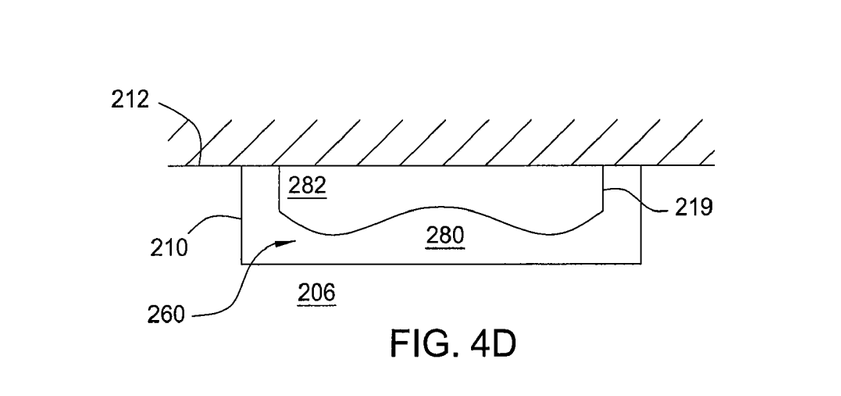

Returning to the embodiment depicted in FIG. 2, a spacing gradient 260 is defined between the gas distribution plate 210 and the blocker plate 219, thereby controlling the intermixing between the gas flowing through the blocker plate 219 and the gas provided directly into the main plenum 280. A spacing gradient is defined as the change in distance between the facing portions of the gas distribution plate 210 and the blocker plate 219. In the embodiment depicted in FIG. 2, the spacing gradient 260 is defined between a flat gas distribution plate 210 and a curved blocker plate 219. It is contemplated that both the gas distribution plate 210 and blocker plate 219 may be curved but have different curvatures as to define the spacing gradient 260, as shown in FIG. 4A. It is also contemplated that the spacing gradient 260 may be defined between a curved gas distribution plate 210 and a flat blocker plate 219, as shown in FIG. 4B. It is also contemplated that the curvatures may be convex, concave, be defined by a series of steps, or include other complex or irregular shape that results in a change in the distance between the gas distribution plate 210 and the blocker plate 219 such that a spacing gradient 260 is defined, as shown in FIGS. 4C-D.

The gas distribution plate 210 and the blocker plate 219 may have sufficient rigidity to maintain the shape of the spacing gradient during operation. Optionally, one or both of the gas distribution plate 210 and the blocker plate 219 may be configured to enable its profile to be changed, thereby changing the shape of the spacing gradient defined therebetween. For example, an optional spacer or an actuator may be used to define and change the spacing gradient between the gas distribution plate 210 and the blocker plate 219. In one embodiment, a spacer or threaded member may be used to control the curvature of the blocker plate 219. In another embodiment, an actuator, such as a pneumatic cylinder, may extend through the lid 212 and interface with the blocker plate 219. The curvature of the blocker plate 219 may be adjusted during maintenance, or the curvature of the blocker plate 219 may be adjusted either while deposition of a single layer is being performed or between depositing different material layers on the substrate. Alternatively, or in addition to controlling the curvature of the blocker plate 219, the curvature of the gas distribution plate 210 may be selected to control the intermixing of the gases flowing through the blocker plate 219 and the gas provided directly into the main plenum 280. In the embodiment depicted in FIG. 2, a spacer 270 is provided to maintain the curvature of the blocker plate 219 relative to the gas distribution plate 210. The spacer 270 is held in position by a screw 272 that is threaded into the lid 212. A seal 274, such as an o-ring, is engaged with at least one of the screw 272 or the spacer 270. The seal 274 also engages the lid 212 such that the vacuum integrity of the vacuum process chamber 200 is not compromised.

Figure 5:
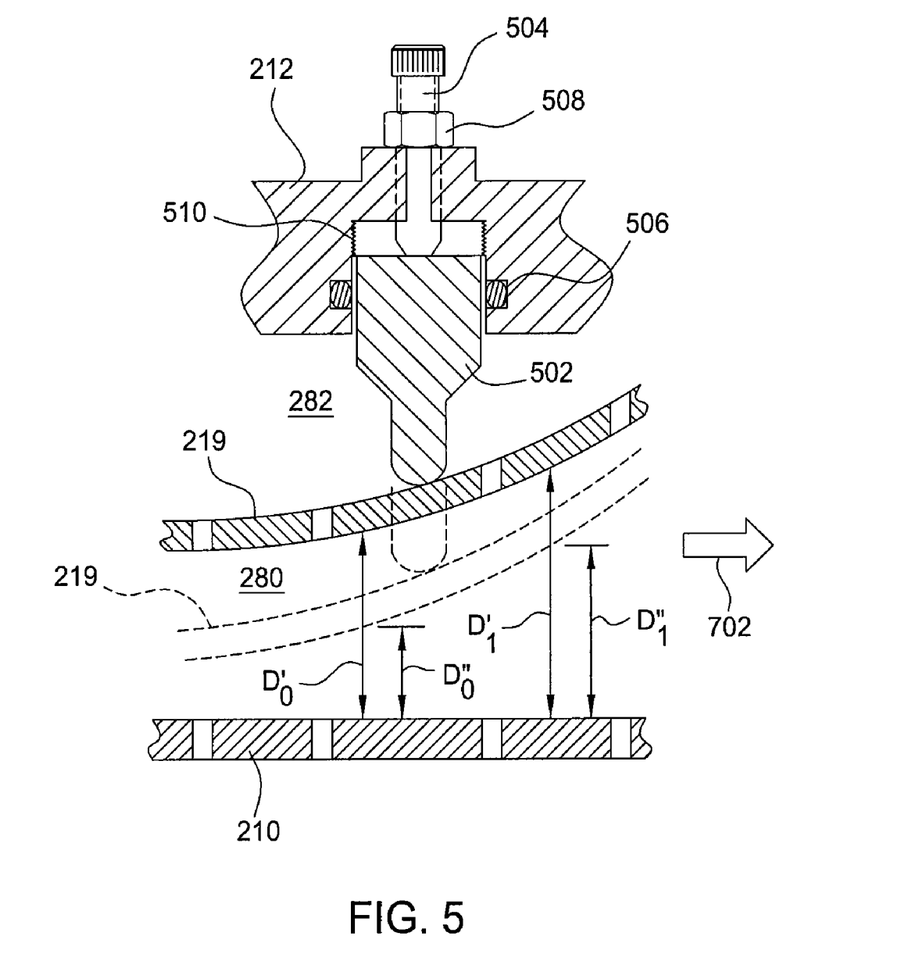
FIG. 5 depicts one embodiment of a blocker plate adjustment mechanism.

FIG. 5 depicts another embodiment of a mechanism for adjustably controlling the curvature of the blocker plate 219. In the embodiment depicted in FIG. 5, a spacer 502 is disposed in a guide hole 510 formed in the lid 212. The spacer 502 is sealed to the lid 212 by an o-ring 506. A threaded member or actuator 504 is utilized to set the projection of the spacer 502 relative to the bottom surface of the lid 212, thereby controlling the curvature of the blocker plate 219. By adjusting the threaded member 504, the spacer 502 may be extended or retracted relative to the gas distribution plate 210 to move the blocker plate 219 between the position shown and a position indicated in phantom in FIG. 5. The change in the curvature of the blocker plate 219, along with its relative distance to the gas distribution plate 210, controls the radial component of the gas exiting the blocker plate 219 from the staging plenum 282 into the main plenum 280 as indicated by arrow 302, and ultimately the mixing of gases within the main plenum 280 and the resultant gas composition gradient of the gas mixture entering the process volume 206 through the gas distribution plate 210. Although in the embodiment depicted in FIG. 5 the threaded member 504 is depicted as a socket head cap screw which can be secured by a lock nut 508, it is contemplated that a pneumatic actuator, electric actuator or other linear or rotary actuator may be alternatively utilized to control the curvature of the blocker plate 219.

The shape of the curvature of the blocker plate 219 may be selected to meet specific process requirements. The spacing gradient controls the lateral distribution of gases passing through the blocker plate 219 within the main plenum 280, thereby creating a ratio or gradient of dilution of the gases provided directly to the main plenum 280 through the main plenum gas inlet ports 215, 217, and producing a lateral gas composition gradient of the gas mixture passing through the gas distribution plate 210 and into the process volume 206. A smaller spacing gradient, i.e., a flatter blocker plate 219, will produce a higher concentration of gases provided from the staging plenum in the center of the process volume 206, while a large spacing gradient, i.e., a fairly curved blocker plate 219 will promote greater mixing of gases within the main plenum 280 and, therefore, a smaller gradient of gas composition entering the process volume 206. A very large spacing gradient, i.e., a highly curved blocker plate 219 will promote greater mixing of gases at the perimeter of the main plenum 280 and, therefore, an inverse of the gradient of gas composition entering the process volume 206 from a relatively flat blocker plate 219. Therefore, selection of the spacing gradient may be utilized to tune the film property and thickness uniformity across the edge and center of the substrate by providing an additional process control variable which allows enhanced film optimization and control. In one embodiment, the center of the blocker plate 219 is closer to the gas distribution plate 210 relative to the edges of the blocker plate 219 so that the spacing defined between the blocker plate 219 and the gas distribution plate 210 increases moving away from the center of the blocker plate 219.

Figure 6:
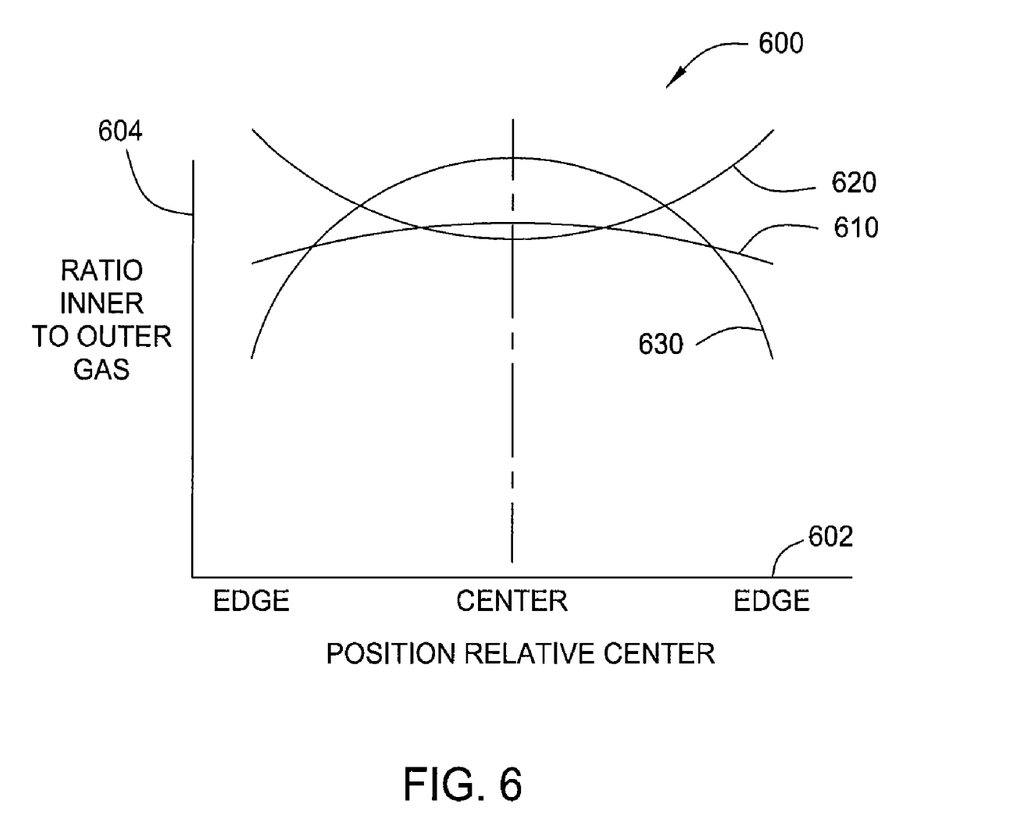
FIG. 6 depict a graph illustrating gas dilution ratios produced by different spacing gradients.

FIG. 6 depicts a graph 600 illustrating a ratio of inner gas to outer gas provided to the process volume 206 through the gas distribution plate 210 produced by different spacing gradients. Inner gas is the gas provided through the staging plenum 282 while the outer gas is the gas provided directly to the main plenum 280 (i.e., without passing through the staging plenum 282) which is subsequently diluted by the inner gas. The x-axis 602 indicates the position relative to the center of the gas distribution plate 210 while the y-axis 604 indicates the ratio of inner to outer gas. Trace 610 illustrates a spacing gradient that highly dilutes the outer gas approximate the center of the gas distribution plate 210. The curvature of trace 610 may be controlled by the relative flows into the staging plenum 282 and the flows into the main plenum 280 through their respective inlet ports, along with the magnitude of spacing gradient utilized. For example, a steeper spacing gradient, e.g., a rapidly diverging blocking and gas distribution, will produce a trace 620 illustrating a higher ratio of inner gas to outer gas near the edge of the gas distribution plate 210. Conversely, a flatter blocker plate 219 will result in a trace 630 illustrating less inner gas provided near the edge of the gas distribution plate 210.

Figure 7:
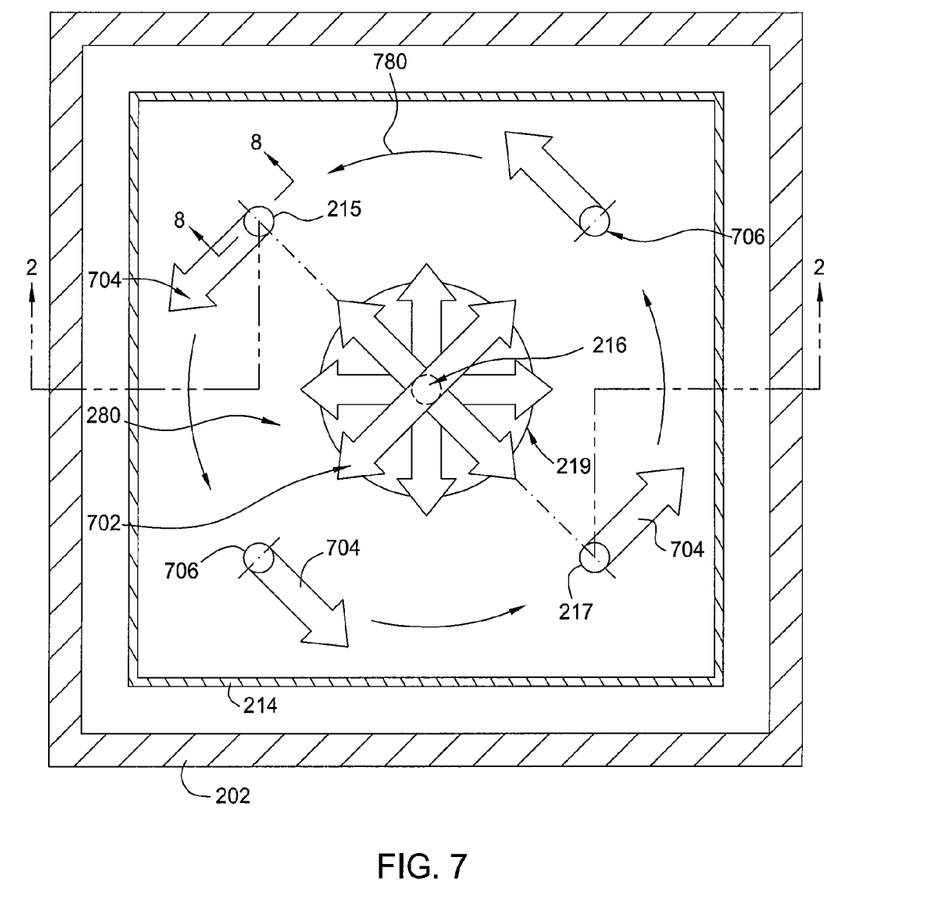
FIG. 7 depicts a sectional view of the vacuum process chamber of FIG. 2 taken along section lines 7-7.

FIG. 7 depicts a sectional view of the vacuum process chamber 200 taken along section lines 7-7 of FIG. 2 that passes through the main plenum 280. Gases exiting the blocker plate 219 are directed by the shape of the spacing gradient 260, in this example towards the perimeter of the gas distribution plate 210 as depicted by arrows 702. The magnitude of the radial component of the gases indicated by arrows 702 may be controlled by the profile of the spacing gradient along with the amount of flow provided through the staging plenum gas inlet port 216. Arrows 704 illustrate the direction of gases entering the main plenum 280 directly from the main plenum gas inlet ports 215, 217. As discussed above, additional main plenum gas inlet ports may be utilized, for example, as shown by main plenum gas inlet ports 706. The main plenum gas inlet ports 215, 217, 706 may be positioned in a polar array, a grid pattern or other suitable arrangement. In one embodiment, the direction of the gas provided by the main plenum gas inlet ports 215, 217, 706, as illustrated by arrows 704, is selected to induce a substantially circular flow within the main plenum 280 relative to a center line of the blocker plate 219 (coinciding with the chamber center), as illustrated by reference numeral 780.

In the embodiment depicted in FIG. 7, the arrows 704 having an orientation substantially tangential to the radial component of the flow exiting the blocker plate 219, as indicated by arrows 702. The circular flow reduces differences in the gas dilution at a given radius while still maintaining an edge to center gradient of gas ratios within the main plenum 208. The circulating and radial flows within the main plenum 280 that promotes the edge to center gradient of gas ratios within the main plenum 208 results in the gases entering the process volume through the gas distribution plate 210 to exhibit an edge to center gradient that can be controlled to influence the edge to center film properties and deposition rates.

Figure 8:
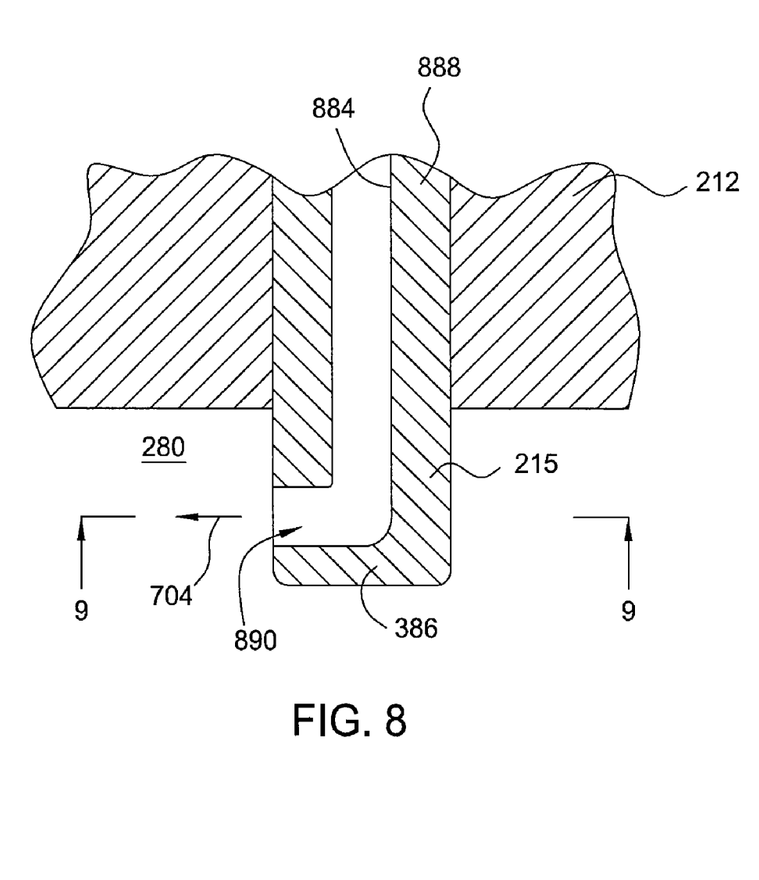
FIG. 8 depicts a partial sectional view of a directional flow of a nozzle taken along section line 8-8 of FIG. 7.
Figure 9:
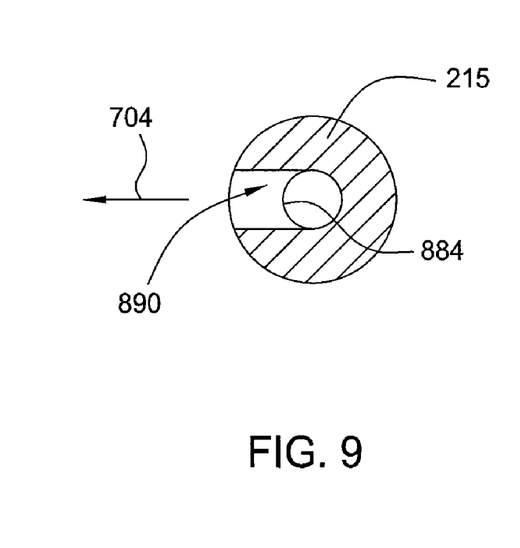
FIG. 9 depicts a sectional view of the nozzle of FIG. 8 taken along section line 9-9.

FIGS. 8-9 depict one embodiment of the main gas plenum inlet port 215 configured to provide directional orientation of the gases exiting the port. The other main plenum gas inlet ports may be similarly configured. In the embodiment depicted in FIG. 8, the main plenum gas inlet port 215 includes a main body 888 that projects to a head 886 disposed below the lid 212 and into the main plenum 280. A passage 884 is disposed through the main body 888 and is coupled to the gas source 220. An outlet port 890 is formed through the head 886 and coupled to the passage 884. The outlet port 890 is generally oriented substantially perpendicular to the center line of the passage 884 and substantially parallel to the bottom of the lid 212. Gases exiting the outlet port 890 are directed in a direction as shown by arrow 704. The main body 888 may have a key or other orientation feature which allows the orientation of the outlet port 890 to be set facing a pre-defined direction. In one example, the orientation of the outlet port 890 may be set to produce a flow tangential to the center line of the chamber body 201.

Figure 10:
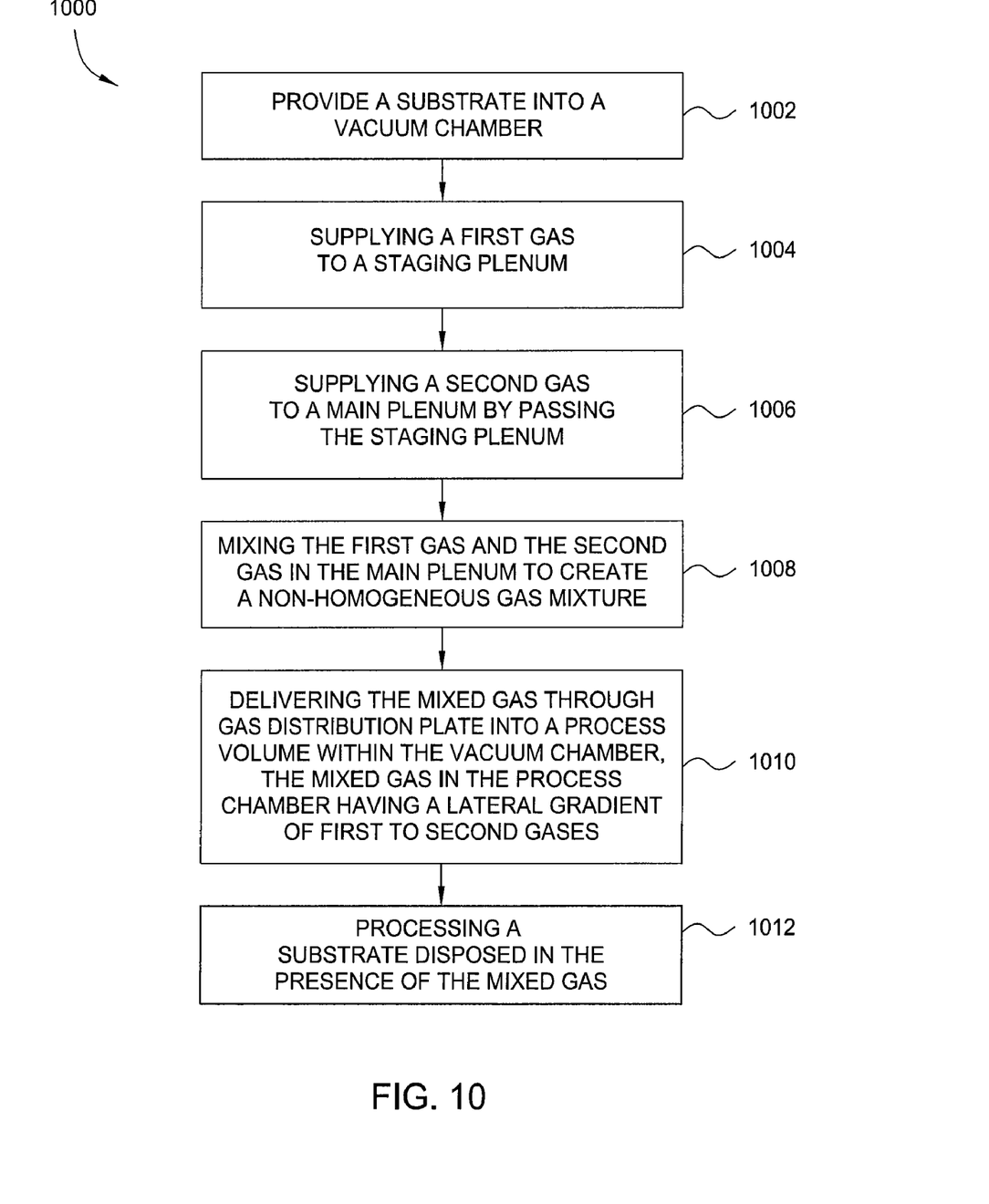
FIG. 10 depicts a process flow diagram of one embodiment of a method for depositing a film that may be practiced in the vacuum process chamber of FIG. 2.

FIG. 10 depicts a flow diagram of one embodiment of a process 1000 that may be practiced in the vacuum process chamber 200 or other suitable process chamber. In the embodiment shown in FIG. 10, the process 1000 illustrates a method for depositing a silicon containing layer that may be used in TFT devices, or other devices. the process 1000 may readily be adapted for etch, ion implant, plasma treatment, annealing and nitration among other processes.

The process 1000 begins at step 1002 by providing a substrate in the vacuum process chamber 200. The substrate may have an optional dielectric layer, a gate electrode layer and a gate insulator layer previously formed thereon. It is noted that the substrate may have different combination of films, structures or layers previously formed thereon to facilitate forming different device structures on the substrate. In one embodiment, the substrate may be any one of glass substrate, plastic substrate, polymer substrate, metal substrate, singled substrate, roll-to-roll substrate, or other suitable transparent substrate suitable for forming a thin film transistor thereon.

At step 1004, a first gas is supplied into the staging plenum 282 from the staging plenum gas inlet port 216. The first gas flows from the staging plenum 282 through the blocker plate 219 into the main plenum 280. At step 1006, a second gas is supplied into the main plenum 280 from the main plenum gas inlet ports 215, 217, 706. At step 1008, the first and second gases mix in the main plenum 280 to form a non-homogenous gas mixture. The local ratio of the first gas to the second gas comprising non-homogenous gas mixture is controlled by the spacing gradient 260 and/or the relative amounts of gases provided through the gas inlet ports, such that a gradient of gas ratios is formed.

In one embodiment, the first gas is a silicon-based gas. Suitable silicon-based gases include, but are not limited to silane ($SiH_4$), disilane ($Si_2H_6$), silicon tetrafluoride ($SiF_4$), silicon tetrachloride ($SiCl_4$), dichlorosilane ($SiH_2Cl_2$), and combinations thereof. In one embodiment, the silicon-based gas is silane ($SiH_4$).

In one embodiment, the second gas is hydrogen-based gas. Suitable hydrogen-based gases include, but are not limited to, hydrogen gas ($H_2$).

In one embodiment, the hydrogen-based gas is provided to the staging plenum 282, while the silicon-based gas is provided directly to the main plenum 280. Alternatively, the silicon-based gas may be provided to the staging plenum 282, while the hydrogen-based gas is provided directly to the main plenum 280. Alternatively, the first and/or second gas may be an etching gas, a plasma treatment gas, a nitration gas, an annealing gas or other gas selected to process a substrate in a process chamber.

At step 1010, the mixed gas is delivered through the gas distribution plate 210 from the main plenum 280 into the process volume 206. The mixed gas within the process volume 206 may be energized by applying RF power to the gas distribution plate 210 or other suitable energy transmission source.

At step 1012, the substrate is processed in the presence of the gas mixture within the process volume 206. In one embodiment, step 1012 deposits a film on the substrate via a chemical vapor deposition process from the mixed gases. In one embodiment, the deposited film is a silicon-containing film. It is contemplated that the mixed gases may alternatively be utilized at step 1012 to perform other processes in suitably configured process chambers, such as, for example, etching, nitration, plasma treatment, ion implantation, doping and the like, as opposed to a deposition process.

As the spacing gradient provides a larger processing window as compared to conventional processes, different types of silicon films may be deposited in-situ a single chamber without unduly sacrificing the performance and/or quality of one film for the benefit of the other.

Figure 11:
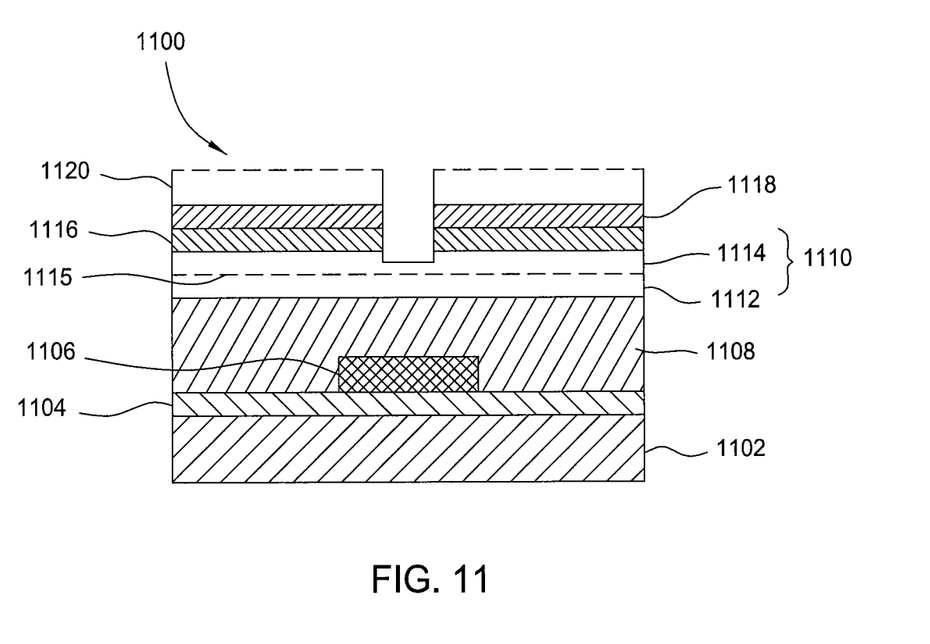
FIG. 11 depicts one embodiment of a device structure having a microcrystalline silicon layer formed in accordance with an embodiment of the present invention.

FIG. 11 depicts one embodiment of a device structure 1100 having one or more silicon-based layers described below formed in accordance with an embodiment of the present invention, for example, by utilizing a process chamber having a spacing gradient and/or by utilizing the process 1000. In one embodiment, the device structure 1100 is a thin film transistor device formed on a substrate 1102. The device structure 1100 may optionally include a dielectric layer 1104 disposed on the substrate 1102. Subsequently, a gate electrode 1106 is formed and patterned on the dielectric layer 1104 followed by a gate insulator layer 1108. A microcrystalline silicon layer 1110 may then be deposited on the gate insulator layer 1108. In one embodiment, microcrystalline silicon layer 1110 may comprise a composite film having a first layer 1112 and a second layer 1114, shown as separated by dotted line 1115 in FIG. 11. After deposition of the microcrystalline silicon layer 1110, an n-type or p-type amorphous silicon layer (N$^+$/P$^+$-a-Si) 1116 and the source-drain metal electrode layer 1118 may be consecutively deposited to form the device structure 1100. Optionally, a capping layer 1120 may be formed over the n-type or p-type amorphous silicon layer (N$^+$/P$^+$-a-Si) 1116 and the source-drain metal electrode layer 1118. The optional capping layer 1120 may be an appropriate silicon-containing layer that may assist improving current leakage control and device performance. In one embodiment, the optional capping layer 1120 is an amorphous silicon layer. It is noted that the optional capping layer 1120 or other silicon-containing layers may be integratedly deposited in-situ the vacuum process chamber 200 in which the microcrystalline silicon layer 1110 was formed.

After deposition of the microcrystalline silicon layer 1110, including the first layer 1112 and the second layer 1114, and the optional capping layer 1120, the n-type or p-type amorphous silicon layer (N$^+$/P$^+$-a-Si) 1116 and the source-drain metal electrode layer 1118 may be then consecutively disposed thereover to form the device structure 1100. The film stack then may also be etched or patterned to form features and/or trenches therein to form a desired device structure, as shown in FIG. 11.

Thus, the apparatus and method described herein advantageously improves the uniformity of the film properties and the film thickness of the device structure by controlling both the film properties and the film thickness of the semiconductor layer, such as a microcrystalline silicon containing layer, at the same time within the same process chamber.

While the foregoing is directed to embodiments of the present invention, other and further embodiments of the invention may be devised without departing from the basic scope thereof, and the scope thereof is determined by the claims that follow.

What is claimed is:

1. A vacuum process chamber, comprising:
    a chamber body having a process volume defined therein;
    a lid disposed on the chamber body;
    a blocker plate coupled to the lid and bounding a staging plenum therewith, the blocker plate comprising a plurality of apertures;
    a gas distribution plate coupled to the lid, the gas distribution plate separating a main plenum defined between the gas distribution plate and the blocker plate from the process volume, the gas distribution plate comprising a plurality of apertures for allowing gas to flow from the main plenum into the process volume, wherein the blocker plate and the gas distribution plate define a spacing gradient therebetween; and
    a plurality of directional main plenum gas inlets arranged to induce a circular flow within the main plenum.

2. The vacuum process chamber of claim 1, wherein the blocker plate has a curvature different than that of the gas distribution plate.

3. The vacuum process chamber of claim 2, wherein a center of the blocker plate is closer to the gas distribution plate than the edges of the blocker plate.

4. The vacuum process chamber of claim 3, wherein the gas distribution plate is flat.

5. The vacuum process chamber of claim 1, further comprising:
    a spacer or an actuator configured to modify the curvature of at least one of the blocker plate or the gas distribution plate.

6. The vacuum process chamber of claim 2, wherein the blocker plate and the gas distribution plate are both curved.

7. The vacuum process chamber of claim 1 further comprising:
    a plurality of directional main plenum gas inlets arranged to induce a circular flow within the main plenum.

8. The vacuum process chamber of claim 1 further comprising:
    at least one staging plenum gas inlet arranged to provide a first gas from a gas source to the staging plenum.

9. The vacuum process chamber of claim 8 further comprising:
    a flow control device configured to split flow from the gas source between the directional main plenum gas inlets and the at least one staging plenum gas inlet.

10. The vacuum process chamber of claim 8 further comprising:
    a second gas source coupled to the directional main plenum gas inlets.

11. A vacuum process chamber, comprising:
    a chamber body having a process volume defined therein;
    a lid disposed on the chamber body;
    a gas distribution plate coupled to the lid, the gas distribution plate separating a main plenum defined between the gas distribution plate and the lid from the process volume, the gas distribution plate comprising a plurality of apertures for allowing gas to flow from the main plenum into the process volume;
    a curved blocker plate coupled to the lid and bounding a staging plenum therewith, the blocker plate comprising a plurality of apertures for allowing gas to flow from the staging plenum to the main plenum, wherein a center of the blocker plate is closer to the gas distribution plate than the edges of the blocker plate;
a plurality of directional main plenum gas inlets arranged to induce a circular flow within the main plenum; and
at least one staging plenum gas inlet arranged to provide a first gas from a gas source to the staging plenum.

12. The vacuum process chamber of claim 11, further comprising:
a spacer or an actuator configured to modify the curvature of at least one of the blocker plate or the gas distribution plate.

* * * * *

UNITED STATES PATENT AND TRADEMARK OFFICE
CERTIFICATE OF CORRECTION

PATENT NO. : 8,147,614 B2
APPLICATION NO. : 12/794756
DATED : April 3, 2012
INVENTOR(S) : White et al.

It is certified that error appears in the above-identified patent and that said Letters Patent is hereby corrected as shown below:

In the Claims:
Column 10, Claim 7, Lines 40-43, please delete "The vacuum process chamber of claim 1 further comprising: a plurality of directional main plenum gas inlets arranged to induce a circular flow within the main plenum.".

Signed and Sealed this
Seventeenth Day of July, 2012

David J. Kappos
*Director of the United States Patent and Trademark Office*